United States Patent
Choi (10) Patent No.: US 11,538,531 B2
(45) Date of Patent: Dec. 27, 2022

(54) MEMORY DEVICE AND METHOD OF OPERATING THE SAME

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/155,689

(22) Filed: Jan. 22, 2021

(65) Prior Publication Data
US 2022/0036956 A1     Feb. 3, 2022

(30) Foreign Application Priority Data

Jul. 29, 2020    (KR) .................. 10-2020-0094267

(51) Int. Cl.
| | | |
|---|---|---|
| G11C 7/00 | (2006.01) | |
| G11C 16/24 | (2006.01) | |
| G11C 16/34 | (2006.01) | |
| G11C 16/26 | (2006.01) | |
| G11C 16/04 | (2006.01) | |

(52) U.S. Cl.
CPC .......... *G11C 16/24* (2013.01); *G11C 16/0483* (2013.01); *G11C 16/26* (2013.01); *G11C 16/3459* (2013.01)

(58) Field of Classification Search
CPC ......... G11C 7/12; G11C 11/4094; G11C 7/22; G11C 7/1048; G11C 11/4091
USPC .............................................. 365/203, 189.06
See application file for complete search history.

(56) References Cited

U.S. PATENT DOCUMENTS

2016/0035432 A1*   2/2016   Park ................... G11C 13/0028
                                                                                      365/72
2018/0247685 A1*   8/2018   Park ....................... G11C 16/26

FOREIGN PATENT DOCUMENTS

| KR | 10-1082614 | 11/2011 |
|---|---|---|
| KR | 10-2017-0098716 | 8/2017 |

\* cited by examiner

*Primary Examiner* — Son T Dinh
(74) *Attorney, Agent, or Firm* — IP & T Group LLP (57) ABSTRACT

Provided herein may be a memory device, a method of operating the same and a page buffer. The memory device may include a plurality of memory cells and a plurality of page buffers. The plurality of page buffers may be coupled to the plurality of memory cells through a plurality of bit lines. The plurality of page buffers may perform a bit line precharge operation of precharging first bit lines coupled to first memory cells, among the plurality of memory cells, to a first voltage, the bit line precharge operation being included in a memory operation of detecting threshold voltages of the first memory cells, and clamp potentials of second bit lines coupled to second memory cells, among the plurality of memory cells, to a second voltage during the memory operation.

20 Claims, 10 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0094267, filed on Jul. 29, 2020, which is incorporated herein by reference in its entirety.

BACKGROUND

Field of Invention

Various embodiments of the present disclosure generally relate to an electronic device, and more particularly to a memory device and a method of operating the memory device.

Description of Related Art

A storage device stores data under the control of a host device such as a computer or a smartphone. The storage device may include a memory device in which data is stored and a memory controller which controls the memory device. Generally, there are two types of memory devices: volatile memory devices and nonvolatile memory devices.

In a volatile memory device data is stored only when power is supplied; stored data is lost when the supply of power is interrupted. Examples of volatile memory devices include a Static Random Access Memory (SRAM) and a Dynamic Random Access Memory (DRAM).

In a nonvolatile memory device stored data is retained even when the supply of power is interrupted. Examples of nonvolatile memory devices include a Read Only Memory (ROM), a Programmable ROM (PROM), an Electrically Programmable ROM (EPROM), an Electrically Erasable and Programmable ROM (EEPROM), and a flash memory.

SUMMARY

Various embodiments of the present disclosure are directed to a memory device in which bit line coupling is improved and a method of operating the memory device.

An embodiment of the present disclosure may provide for a memory device. The memory device may include a plurality of memory cells and a plurality of page buffers. The plurality of page buffers may be coupled to the plurality of memory cells through a plurality of bit lines. The plurality of page buffers may perform a bit line precharge operation of precharging first bit lines coupled to first memory cells, among the plurality of memory cells, to a first voltage, the bit line precharge operation being included in a memory operation of detecting threshold voltages of the first memory cells, and clamp potentials of second bit lines coupled to second memory cells, among the plurality of memory cells, to a second voltage during the memory operation.

An embodiment of the present disclosure may provide for a page buffer. The page buffer may include a switch, a first precharge circuit, and a second precharge circuit. The switch may be coupled between a bit line and a node. The first precharge circuit may be coupled between the node and a supply voltage node and configured to precharge the node to a first voltage based on whether a memory cell coupled to the bit line is a selected memory cell on which a memory operation is performed. The second precharge circuit may be coupled between the node and the supply voltage node and configured to clamp a potential of the node to a second voltage based on whether the memory cell is the selected memory cell.

An embodiment of the present disclosure may provide for a method of operating a memory device including a plurality of memory cells. The method may include performing a bit line precharge operation of precharging first bit lines coupled to first memory cells, among the plurality of memory cells, to a first voltage, precharging second bit lines coupled to second memory cells, among the plurality of memory cells, to a second voltage during the bit line precharge operation, performing an evaluation operation of sensing voltages of the first bit lines determined based on threshold voltages of the first memory cells after the bit line precharge operation, and clamping potentials of the second bit lines to the second voltage during the evaluation operation.

An embodiment of the present disclosure may provide for a method of operating a memory device. The method comprises precharging, during a precharge period, even and odd bit lines to first and second voltage levels, respectively, the even and odd bit lines coupled to even and odd memory cells, respectively; sensing, during an evaluation period, a voltage level of at least one of the even bit lines while maintaining the second voltage level; and latching, during a latch period, data stored in at least one of the even memory cells based on the sensed voltage level.

DETAILED DESCRIPTION

Specific structural and functional description is provided herein to describe embodiments of the present disclosure. The present invention, however, may be practiced in various forms and carried out in various ways; thus, the present invention is not limited to the disclosed embodiments. Also, throughout the specification, reference to "an embodiment" or the like is not necessarily to only one embodiment, and different references to any such phrase are not necessarily to the same embodiment(s). Moreover, the use of an indefinite article (i.e., "a" or "an") means one or more, unless it is clear that only one is intended. Similarly, terms "comprising,"

"including," "having" and the like, when used herein, do not preclude the existence or addition of one or more other elements in addition to the stated element(s).

Figure 1:
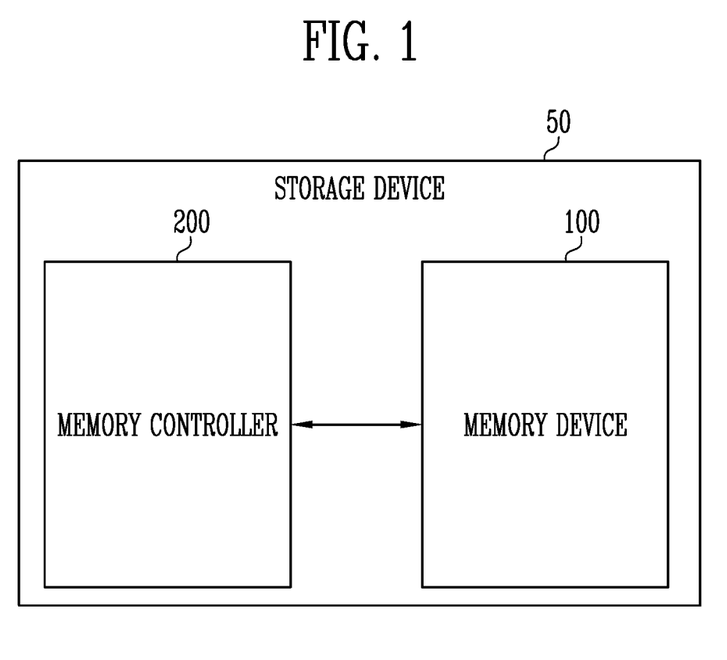
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include a memory device 100 and a memory controller 200 which controls the operation of the memory device. The storage device 50 may store data under the control of a host, such as a mobile phone, a smartphone, an MP3 player, a laptop computer, a desktop computer, a game console, a television (TV), a tablet personal computer (PC), or an in-vehicle infotainment system.

The storage device 50 may be manufactured as any of various types of storage devices depending on a host interface that specifies a communication protocol with the host. For example, the storage device 50 may be implemented as any of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and/or a memory stick.

The storage device 50 may be manufactured in any of various types of package forms. For example, the storage device 50 may be manufactured in any of various types of package forms, such as package on package (POP), system in package (SIP), system on chip (SOC), multi-chip package (MCP), chip on board (COB), wafer-level fabricated package (WFP), and/or wafer-level stack package (WSP).

The memory device 100 may store data. The memory device 100 may be operated in response to the control of the memory controller 200. The memory device 100 may include a memory cell array including a plurality of memory cells which store data.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, a page may be a unit by which data is stored in the memory device 100 or by which data stored in the memory device 100 is read.

A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, by way of example, features and aspects of the invention are described in the context in which the memory device 100 is a NAND flash memory.

The memory device 100 may receive a command and an address from the memory controller 200, and may access the area of the memory cell array, selected by the address. That is, the memory device 100 may perform an operation indicated by the command on the area selected by the address. For example, the memory device 100 may perform a write operation (i.e., a program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory controller 200 controls overall operation of the storage device 50.

When power is supplied to the storage device 50, the memory controller 200 may run firmware (FW). When the memory device 100 is a flash memory device, the memory controller 200 may run firmware such as a flash translation layer (FTL) for controlling communication between the host and the memory device 100.

In an embodiment, the memory controller 200 may receive data and a logical block address (LBA) from the host, and may translate the logical block address (LBA) into a physical block address (PBA) indicating the address of memory cells which are included in the memory device 100 and in which data is to be stored.

The memory controller 200 may control the memory device 100 so that a program operation, a read operation or an erase operation is performed in response to a request received from the host. During the program operation, the memory controller 200 may provide a write command, a physical block address, and data to the memory device 100. During the read operation, the memory controller 200 may provide a read command and a physical block address to the memory device 100. During the erase operation, the memory controller 200 may provide an erase command and a physical block address to the memory device 100.

In an embodiment, the memory controller 200 may autonomously generate a command, an address, and data in the absence of a request from the host, and may transmit them to the memory device 100. For example, the memory controller 200 may autonomously generate and provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 depending on an interleaving scheme to improve operation performance. The interleaving scheme may be an operating manner in which the operating periods of at least two memory devices 100 overlap each other.

The host may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and/or Load Reduced DIMM (LRDIMM) communication methods.

Figure 2:
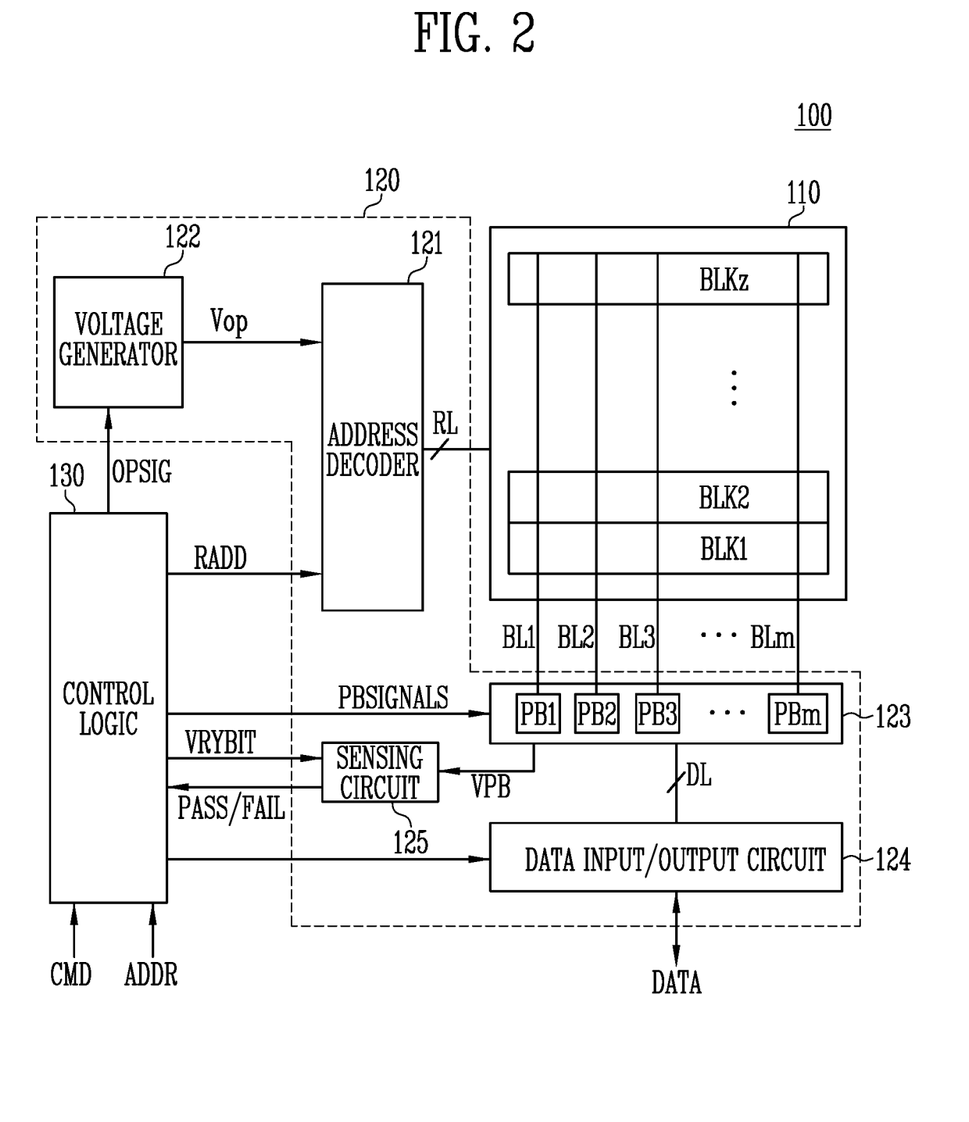
FIG. 2 is a diagram illustrating a structure of a memory device, such as that of FIG. 1.

FIG. 2 is a diagram illustrating the structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz, which are coupled to an address decoder 121 through row lines RL. The memory blocks BLK1 to BLKz are coupled to a read and write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line, among the plurality of memory cells, are defined as one physical page. In other words, the memory cell array 110 may include a plurality of physical pages. In an embodiment of the present disclosure, each of the memory blocks BLK1 to BLKz included in the memory cell array 110 may include a plurality of dummy cells. One or more dummy cells may be coupled in series between a drain select transistor and memory cells and between a source select transistor and memory cells.

Each of the memory cells of the memory device 100 may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so as to perform a program operation, a read operation, and an erase operation.

The address decoder 121 is coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 receives addresses ADDR from the control logic 130.

The address decoder 121 may decode a block address, among the received addresses ADDR. The address decoder 121 selects at least one of the memory blocks BLK1 to BLKz according to the decoded block address. The address decoder 121 may decode a row address among the received addresses ADDR. The address decoder 121 may select at least one word line of the selected memory block according to the decoded row address. The address decoder 121 may apply an operating voltage Vop supplied from the voltage generator 122 to the selected word line.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage higher than the verify voltage to the unselected word lines.

During a read operation, the address decoder 121 may apply a read voltage to the selected word line and apply a read pass voltage higher than the read voltage to the unselected word lines.

In accordance with an embodiment of the present disclosure, an erase operation of the memory device 100 is performed on a memory block basis. During an erase operation, the addresses ADDR input to the memory device 100 include a block address. The address decoder 121 may decode the block address and select at least one memory block according to the decoded block address. During the erase operation, the address decoder 121 may apply a ground voltage to word lines coupled to the selected memory block.

In accordance with an embodiment of the present disclosure, the address decoder 121 may decode a column address, among the received addresses ADDR. The decoded column address may be transferred to the read and write circuit 123. In an embodiment, the address decoder 121 may include components, such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages used by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm, which are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program voltage is applied to a selected word line. Memory cells in a selected page are programmed based on the received data DATA. Memory cells coupled to a bit line to which a program permission voltage (e.g., a ground voltage) is applied may have increased threshold voltages.

The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may control overall operation of the memory device 100. The control logic 130 may be operated in response to a command CMD transmitted from an external device.

The control logic 130 may control the peripheral circuit 120 by generating various types of signals in response to the command CMD and the addresses ADDR. For example, the control logic 130 may generate an operation signal OPSIG, an address ADDR, read and write circuit control signals PBSIGNALS, and the enable bit VRYBIT in response to the command CMD and the addresses ADDR. The control logic 130 may output the operation signal OPSIG to the voltage generator 122, output the address ADDR to the address decoder 121, output the read and write circuit control signal PBSIGNALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

Figure 3:
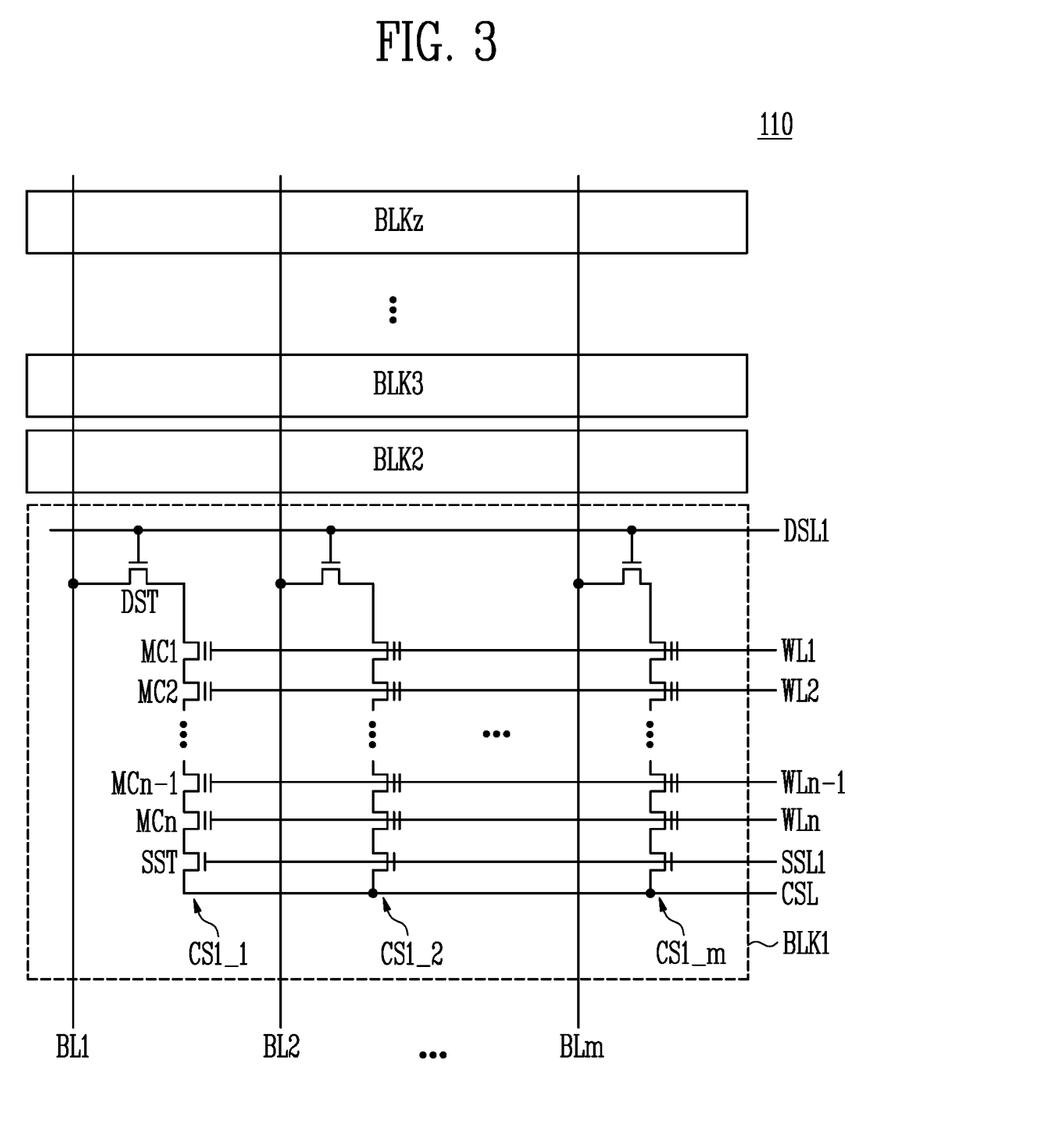
FIG. 3 is a diagram illustrating a memory cell array, such as that of FIG. 2.

FIG. 3 is a diagram illustrating the memory cell array of FIG. 2.

Referring to FIG. 3, the first to z-th memory blocks BLK1 to BLKz are coupled in common to the first to m-th bit lines BL1 to BLm. In FIG. 3, by way of example, elements included in the first memory block BLK1, among the plurality of memory blocks BLK1 to BLKz, are illustrated. It will be understood that each of the remaining memory blocks BLK2 to BLKz has the same configuration as the first memory block BLK1.

The memory block BLK1 may include a plurality of cell strings CS1_1 to CS1_m (where m is a positive integer of 2 or more). The first to m-th cell strings CS1_1 to CS1_m are respectively coupled to the first to m-th bit lines BL1 to BLm. Each of the first to m-th cell strings CS1_1 to CS1_m may include a drain select transistor DST, a plurality of memory cells MC1 to MCn (where n is a positive integer of 2 or more) which are coupled in series to each other, and a source select transistor SST.

A gate terminal of the drain select transistor DST included in each of the first to m-th cell strings CS1_1 to CS1_m is coupled to a drain select line DSL1. Gate terminals of the first to n-th memory cells MC1 to MCn included in each of the first to m-th cell strings CS1_1 to CS1_m are coupled to first to n-th word lines WL1 to WLn, respectively. A gate terminal of the source select transistor SST included in each of the first to m-th cell strings CS1_1 to CS1_m is coupled to a source select line SSL1.

By way of example, the structure of the first cell string CS1_1, among the plurality of cell strings CS1_1 to CS1_m, is described. Each of the remaining cell strings CS1_2 to CS1_m is configured in the same manner as the first cell string CS1_1.

A drain terminal of the drain select transistor DST included in the first cell string CS1_1 is coupled to the first bit line BL1. A source terminal of the drain select transistor DST included in the first cell string CS1_1 is coupled to a drain terminal of the first memory cell MC1 included in the first cell string CS1_1. The first to n-th memory cells MC1 to MCn may be coupled in series to each other. A drain terminal of the source select transistor SST included in the first cell string CS1_1 is coupled to a source terminal of the n-th memory cell MCn included in the first cell string CS1_1. A source terminal of the source select transistor SST included in the first cell string CS1_1 is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
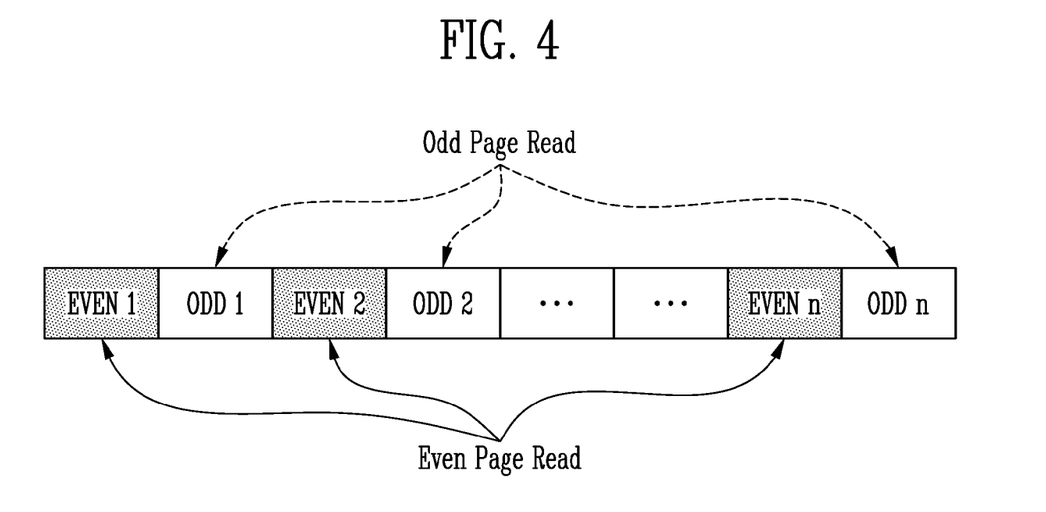
FIG. 4 is a diagram illustrating a read operation performed on some pages.

FIG. 4 is a diagram illustrating a read operation performed on some pages.

Referring to FIG. 4, a single page may include a plurality of memory cells.

Memory cells coupled to even-numbered bit lines are denoted even memory cells. Memory cells coupled to odd-numbered bit lines are denoted odd memory cells.

An even read operation on even memory cells and an odd read operation on odd memory cells may be separately performed.

A read operation may include a bit line precharge operation, an evaluation operation, and a latch operation.

The bit line precharge operation may include increasing the potentials of bit lines coupled to memory cells. The evaluation operation may include sensing the potentials or currents of bit lines determined depending on the threshold voltages of the memory cells. The latch operation may include storing data of the memory cells in a latch based on the sensed potentials or currents of the bit lines.

In an embodiment, when an even read operation is performed, even-numbered bit lines coupled to even memory cells may be precharged during the bit line precharge operation. When an odd read operation is performed, odd-numbered bit lines coupled to odd memory cells may be precharged during the bit line precharge operation.

In an embodiment, when an even read operation or an odd read operation is performed, all bit lines coupled to the plurality of memory cells may be precharged during the bit line precharge operation.

In the case where all bit lines are precharged, the difference between the voltages of adjacent bit lines is smaller than that in the case where even bit lines or odd bit lines are selectively precharged, and thus interference caused by bit line coupling may be minimized.

In various embodiments, an even page that is a half page may be divided into smaller units, e.g., quarter page units, and thus a read operation may be performed on a quarter page basis. An odd page that is a half page may be divided into smaller units, e.g., quarter page units, and thus a read operation may be performed on a quarter page basis.

Figure 5:
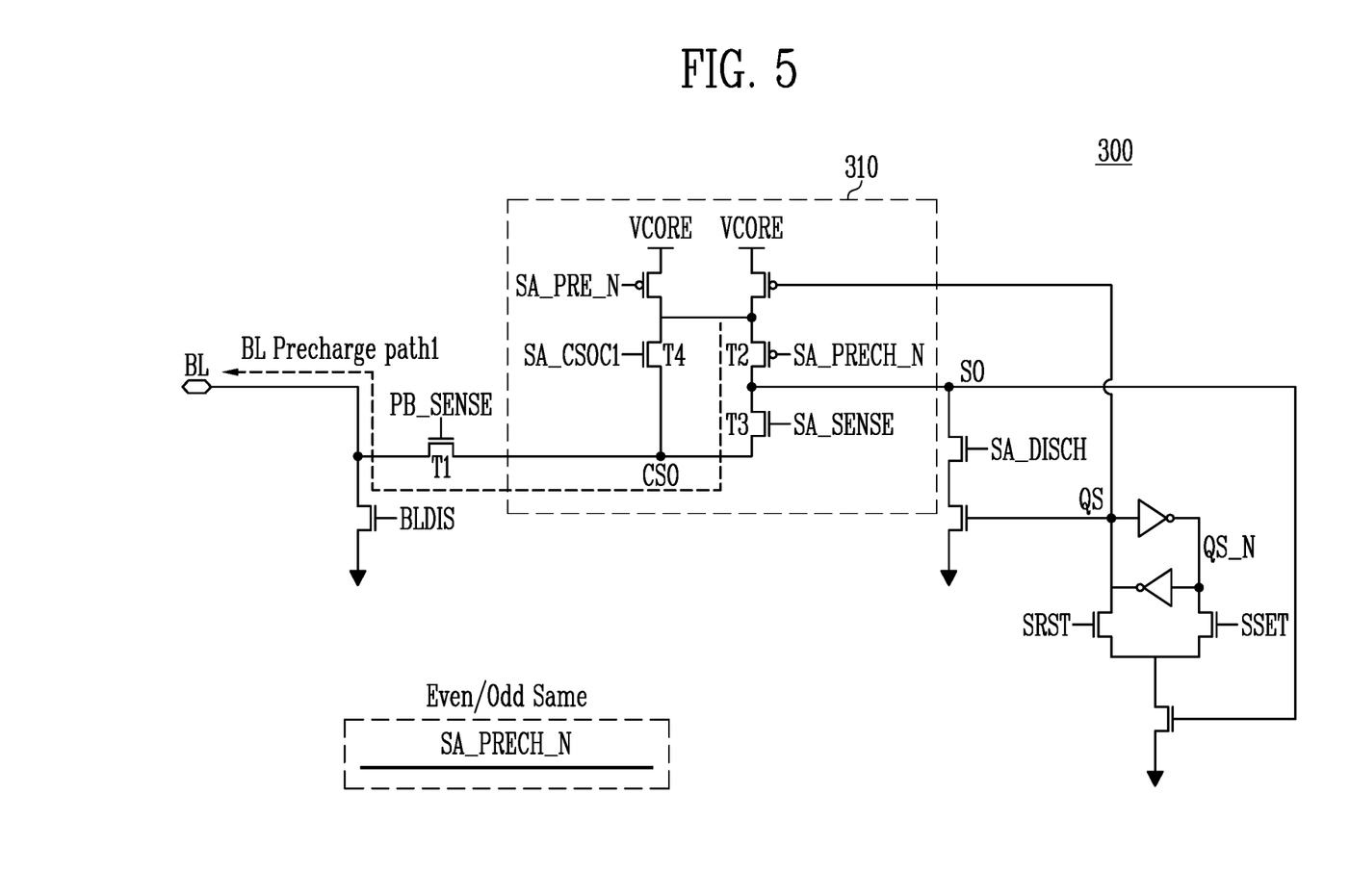
FIG. 5 is a diagram illustrating a structure of a page buffer, such as that of FIG. 2, according to an embodiment.

FIG. 5 is a diagram illustrating the structure of the page buffer of FIG. 2 according to an embodiment.

Referring to FIG. 5, a bit line BL coupled to a memory cell may be coupled to a first node CSO through a first switch T1. When the first node CSO is precharged and the first switch T1 is turned on, the potential of the first node CSO may be transferred to the bit line BL through the first switch T1. That is, the bit line BL may be precharged.

The description below is in the context of performing a memory operation of detecting the threshold voltages of even memory cells. The memory operation may be a read operation or a program verify operation.

The same first precharge signal SA_PRECH_N may be input to both an even page buffer coupled to an even memory cell and to an odd page buffer coupled to an odd memory cell.

When an even read operation is performed, each even bit line coupled to the even page buffer may be precharged through a first precharge path (BL Precharge path1). When the even read operation is performed, each odd bit line coupled to the odd page buffer may be precharged through the first precharge path (BL Precharge path1).

That is, even when the even read operation is performed, all bit lines may be precharged through the first precharge path (BL Precharge path1) during the bit line precharge operation.

A memory operation of detecting the threshold voltages on odd memory cells is performed in the same manner as described above.

Figure 6:
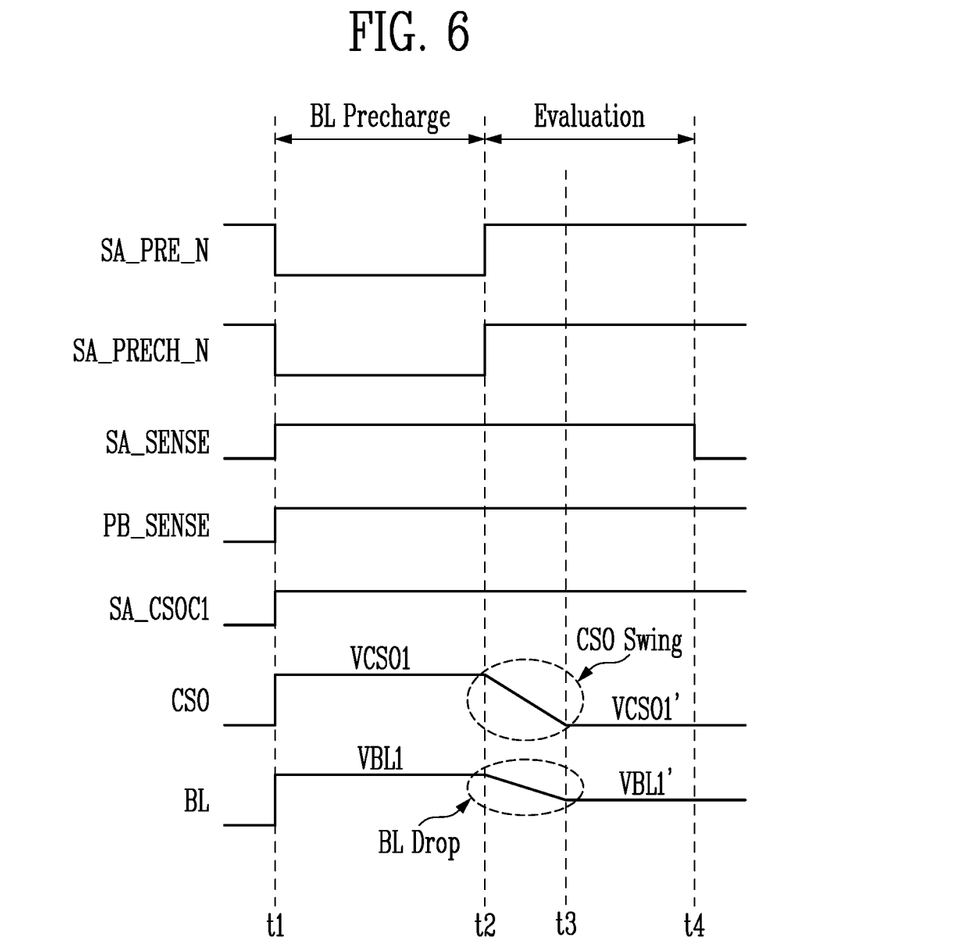
FIG. 6 is a timing diagram illustrating an operation of a page buffer, such as that of FIG. 5.

FIG. 6 is a timing diagram illustrating the operation of the page buffer of FIG. 5.

Referring to FIG. 6, when an even read operation is performed, an odd page buffer may be used. The odd page buffer may be coupled to an odd memory cell on which an even read operation is not performed.

When the even read operation is performed, even memory cells may be selected and odd memory cells may not be selected and thus denoted unselected memory cells. In an embodiment, during an even read operation, odd bit lines may also be precharged together with even bit lines, and thus precharging may be performed faster than in the case where only even bit lines are precharged. Further, since all bit lines are precharged, interference caused by bit line coupling may be minimized. The even read operation may include a bit line precharge operation (period from t1 to t2), an evaluation operation (period from t2 to t4), and a latch operation (not illustrated).

During the bit line precharge operation included in the even read operation, the first node CSO of the odd page buffer may be precharged to a voltage VCSO1. The bit line BL of the odd page buffer may be precharged to a voltage VBL1.

In an embodiment, the voltage of the first node CSO may vary (swing) according to the amount of current flowing through a memory cell coupled to the bit line BL during an evaluation operation. The amount of current flowing through the memory cell may be determined based on the threshold voltage of the memory cell.

In FIG. 6, as the evaluation operation is performed, the voltage of the first node CSO may drop from the voltage VCSO1 to a voltage VCSO1' (CSO swing). When the CSO swing occurs in the voltage of the first node CSO, the voltage of the bit line BL may also drop from the voltage VBL1 to a voltage VBL1' (BL Drop).

To minimize bit line coupling, during an even read operation, the voltage of the odd bit line coupled to the odd page buffer should be constant. That is, the BL Drop should not occur in the odd bit line during the even read operation. In the case of the page buffer structure of FIG. 5, during the evaluation operation, the voltage of the odd bit line drops (BL Drop) due to voltage variation in the first node CSO (CSO swing), and thus the influence of bit line coupling may increase.

The reason for the CSO swing on the first node CSO of the odd page buffer and the BL Drop on the odd bit line during the even read operation is that the same precharge signal SA_PRECH_N is applied to both the even page buffer and the odd page buffer and thus the first node CSO of the odd page buffer on which an even read operation is not performed is precharged to the voltage VCOS1.

In an embodiment, when an odd read operation is performed, the operation of the even page buffer may be performed in the same manner.

Figure 7:
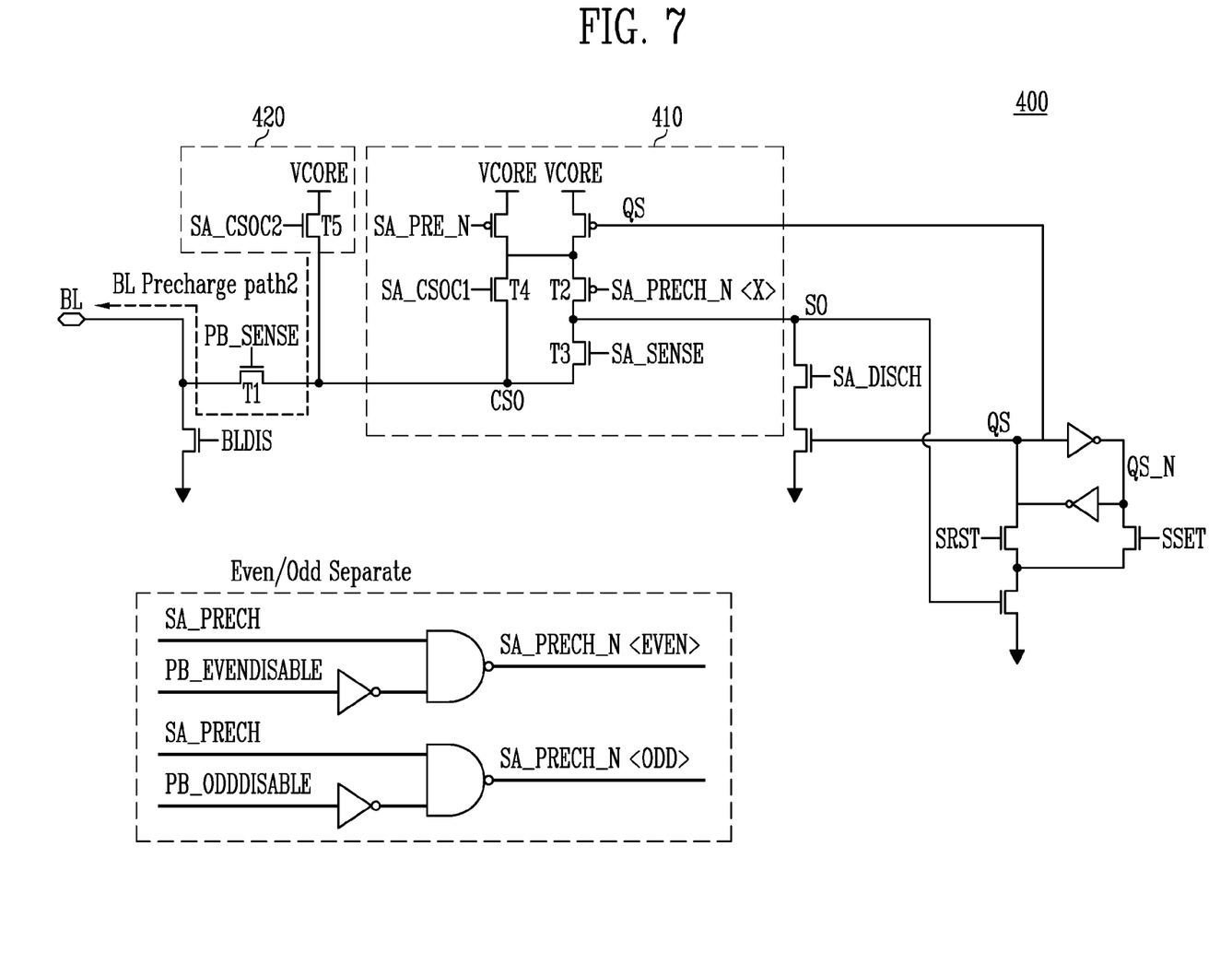
FIG. 7 is a diagram illustrating a structure of a page buffer, such as that of FIG. 2, according to an embodiment.

FIG. 7 is a diagram illustrating the structure of the page buffer of FIG. 2 according to an embodiment.

Referring to FIG. 7, a page buffer 400 may include a first switch T1, a first precharge circuit 410, and a second precharge circuit 420.

The first switch T1 may be coupled between a bit line BL coupled to a memory cell and a first node CSO.

The first precharge circuit 410 may be coupled to the bit line BL through the first switch T1. The first precharge circuit 410 may precharge the first node CSO in response to a first precharge signal SA_PRECH_N <X>.

In an embodiment, the first precharge signal SA_PRECH_N <X> may be either a first precharge signal SA_PRECH_N <EVEN> that is input to an even page buffer or a first precharge signal SA_PRECH_N <ODD> that is input to an odd page buffer.

In an embodiment, the first precharge signal SA_PRECH_N <EVEN> that is input to the even page buffer may be determined based on a common precharge signal SA_PRECH and an even page buffer control signal PB_EVENDISABLE. The first precharge signal SA_PRECH_N <ODD> that is input to the odd page buffer may be determined based on the common precharge signal SA_PRECH and an odd page buffer control signal PB_ODDDISABLE.

The second precharge circuit 420 may be coupled to the bit line BL through the first switch T1. The second precharge circuit 420 may precharge the first node CSO in response to a second precharge signal SA_CSOC2.

In an embodiment, when the first precharge signal SA_PRECH_N <X> is enabled, the second precharge signal SA_CSOC2 may be disabled. When the first precharge signal SA_PRECH_N <X> is disabled, the second precharge signal SA_CSOC2 may be enabled.

In FIG. 7, a description is made on the assumption that an even read operation is performed.

Unlike the page buffer 300 described above with reference to FIG. 5, the first precharge signal SA_PRECH_N <EVEN> that is input to the even page buffer and the first precharge signal SA_PRECH_N <ODD> that is input to the odd page buffer may be distinguished from each other.

In an embodiment, when the precharge signal SA_PRECH_N <EVEN> that is input to the even page buffer is enabled, the precharge signal SA_PRECH_N <ODD> that is input to the odd page buffer may be disabled. When the precharge signal SA_PRECH_N <ODD> that is input to the odd page buffer is enabled, the precharge signal SA_PRECH_N <EVEN> that is input to the even page buffer may be disabled.

Since the precharge signal SA_PRECH_N <EVEN> is enabled during an even read operation, the first precharge circuit 410 of the even page buffer may precharge the first node CSO of the even page buffer in response to the precharge signal SA_PRECH_N <EVEN>. A path through which the bit line BL of the even page buffer is precharged may be identical to the first precharge path described above with reference to FIG. 5.

Since the second precharge signal SA_CSOC2 of the even page buffer is disabled during the even read operation, the second precharge circuit 420 may not influence the first node CSO of the even page buffer.

Since the precharge signal SA_PRECH_N <ODD> is disabled during the even read operation, the first precharge circuit 410 of the odd page buffer may not influence the first node CSO of the odd page buffer.

Since the second precharge signal SA_CSOC2 of the odd page buffer is enabled during the even read operation, the second precharge circuit 420 of the odd page buffer may precharge the first node CSO of the odd page buffer. A path through which the bit line BL of the odd page buffer is precharged may be identical to a second precharge path (BL Precharge path2).

In an embodiment, an odd read operation is performed in the same manner as the even read operation.

Figure 8A:
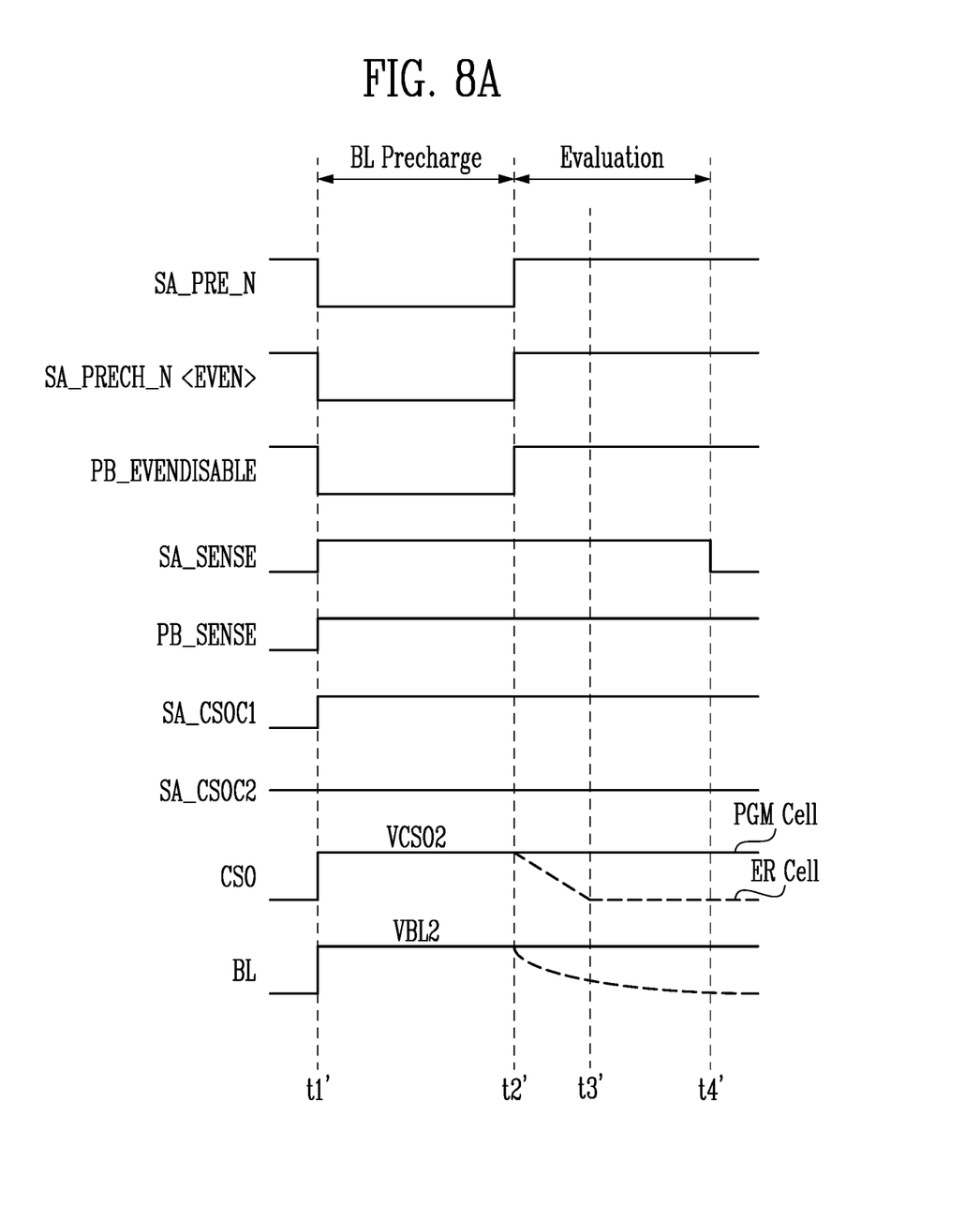
FIG. 8A is a timing diagram illustrating an operation of a page buffer, such as that of FIG. 7, coupled to a selected memory cell on which a memory operation is performed.

FIG. 8A is a timing diagram illustrating the operation of the page buffer of FIG. 7 coupled to a selected memory cell on which a memory operation is performed.

Referring to FIG. 8A, when a memory operation is an even read operation, the operation of an even page buffer coupled to an even memory cell that is the selected memory cell may be performed. The even read operation may include a bit line precharge operation (period from t1' to t2'), an evaluation operation (period from t2' to t4'), and a latch operation (not illustrated).

During the even read operation, the second precharge signal SA_CSOC2 of the even page buffer may be disabled.

During the bit line precharge operation, the first precharge signal SA_PRECH_N <EVEN> of the even page buffer may be enabled, and the first node CSO may be precharged to a voltage VCSO2 through the first precharge circuit of the even page buffer. Since the control signal PB_SENSE of the first switch is enabled and then the first node CSO is coupled to the bit line BL, the bit line BL may be precharged to a voltage VBL2.

In an embodiment, the even page buffer control signal PB_EVENDISABLE, described above with reference to FIG. 7, may be disabled during the bit line precharge operation, and may be enabled during the evaluation operation.

During the evaluation operation, the first precharge signal SA_PRECH_N <EVEN> of the even page buffer may be disabled.

During the evaluation operation, the voltage of the bit line BL may be determined based on the threshold voltage of the even memory cell. When the threshold voltage of the even memory cell is lower than a read voltage, the even memory cell is an on-cell, and thus a bit line current may flow through the memory cell and the voltage of the bit line BL may be discharged. When the threshold voltage of the even memory cell is equal to or higher than the read voltage, the memory cell is an off-cell, and thus a bit line current does not flow through the memory cell, and the voltage of the bit line BL may be maintained at the voltage VBL2.

In an embodiment, in the case of the page buffer coupled to a programmed cell, among even memory cells, through the bit line BL, the first node CSO may be maintained at the precharged voltage VCSO2 during the evaluation operation. In the case of the page buffer coupled to an erased cell, among the even memory cells, through the bit line BL, the voltage of the first node CSO may be discharged during the evaluation operation.

Figure 8B:
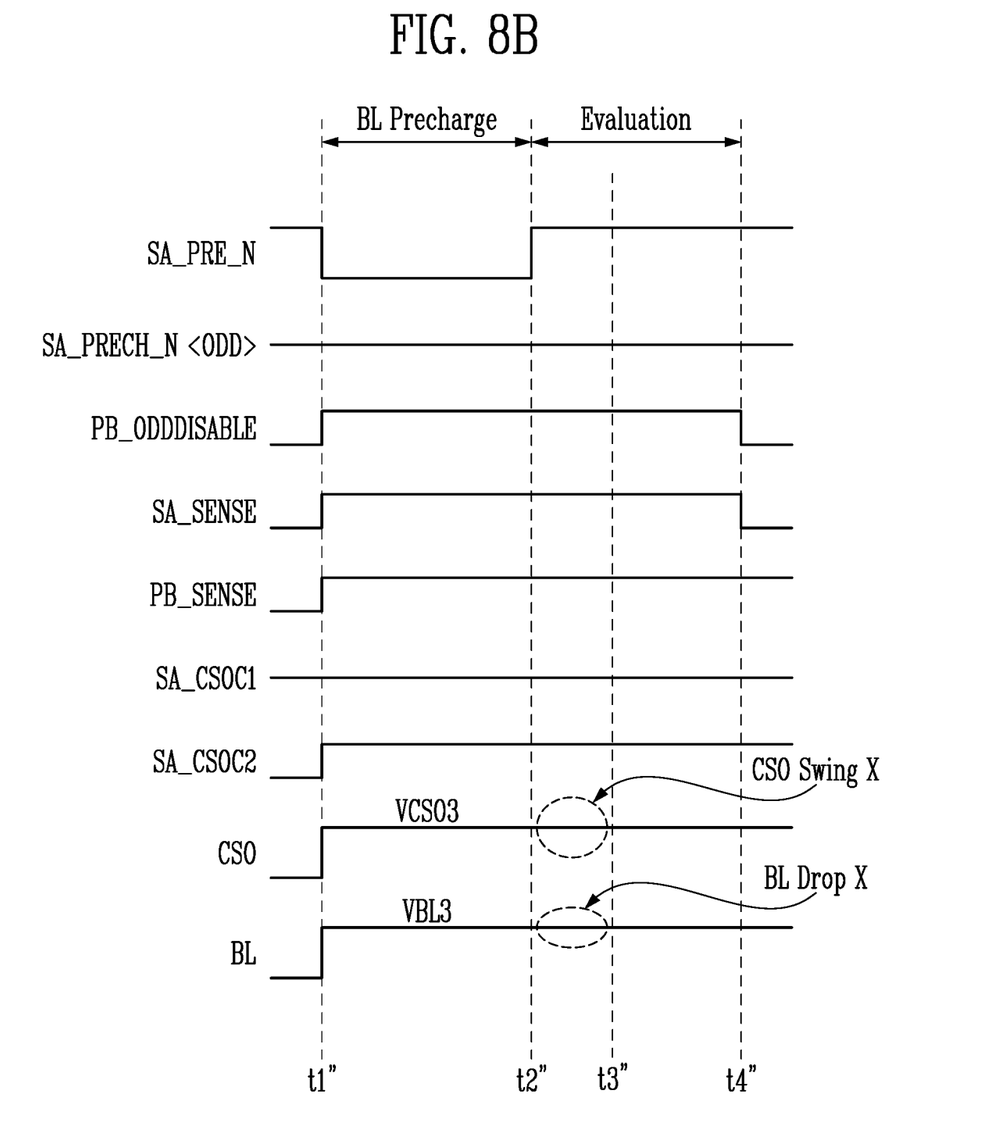
FIG. 8B is a timing diagram illustrating an operation of a page buffer, such as that of FIG. 7, coupled to an unselected memory cell on which a memory operation is not performed.

FIG. 8B is a timing diagram illustrating the operation of the page buffer of FIG. 7 coupled to an unselected memory cell on which a memory operation is not performed.

Referring to FIG. 8B, when a memory operation is an even read operation, the operation of an odd page buffer coupled to an odd memory cell that is an unselected memory cell may be performed. The even read operation may include a bit line precharge operation (period from t1" to t2"), an evaluation operation (period from t2" to t4"), and a latch operation (not illustrated).

During the even read operation, the first precharge signal SA_PRECH_N <ODD> of the odd page buffer may be disabled. During the even read operation, the second precharge signal SA_CSOC2 of the odd page buffer may be enabled.

Since the second precharge signal SA_CSOC2 of the odd page buffer is enabled during the bit line precharge operation, the first node CSO may be precharged to a voltage VCSO3 through the second precharge circuit of the odd page buffer. Since the control signal PB_SENSE of the first switch is enabled and then the first node CSO is coupled to the bit line BL, the bit line BL may be precharged to a voltage VBL3.

In an embodiment, the odd page buffer control signal PB_ODDDISABLE, described above with reference to FIG. 7, may be enabled during the even read operation.

Since the second precharge signal SA_CSOC2 of the odd page buffer continues to be in an enable state during the evaluation operation, the voltage of the first node CSO may be continuously maintained at the voltage VCSO3.

Consequently, while the even read operation is performed, the potential of the first node CSO may be clamped to the constant voltage VCSO3. Since the voltage of the first node CSO is clamped, there is no voltage variation (CSO swing X) in the first node CSO, and the voltage of the bit line BL may be maintained at VBL3 without causing a voltage drop (BL Drop X). During the even read operation, the voltages of odd bit lines adjacent to even bit lines may be maintained at a constant level, and the effect of interference caused by bit line coupling may be minimized.

In an embodiment, the magnitude of the voltage to which the first node CSO is precharged during a bit line precharge operation may be set such that the voltage VCSO3 is lower than or equal to the voltage VCSO1 shown in FIG. 6.

As described with reference to FIG. 8B, in order to remove voltage variation (CSO swing) in the first node CSO, the page buffer 400 described above with reference to FIG. 7 may further include the second precharge circuit 420 unlike the page buffer 300 described above with reference to FIG. 5.

The same first precharge signal may be input to the first precharge circuit 310 of the page buffer 300, regardless of whether the corresponding page buffer is an even page buffer or an odd page buffer. Unlike this, different first precharge signals SA_PRECH_N <EVEN> and SA_PRECH_N <ODD> may be separately input, for an even page buffer and for an odd page buffer, to the first precharge circuit 410 of the page buffer 400 of FIG. 7.

Figure 9:
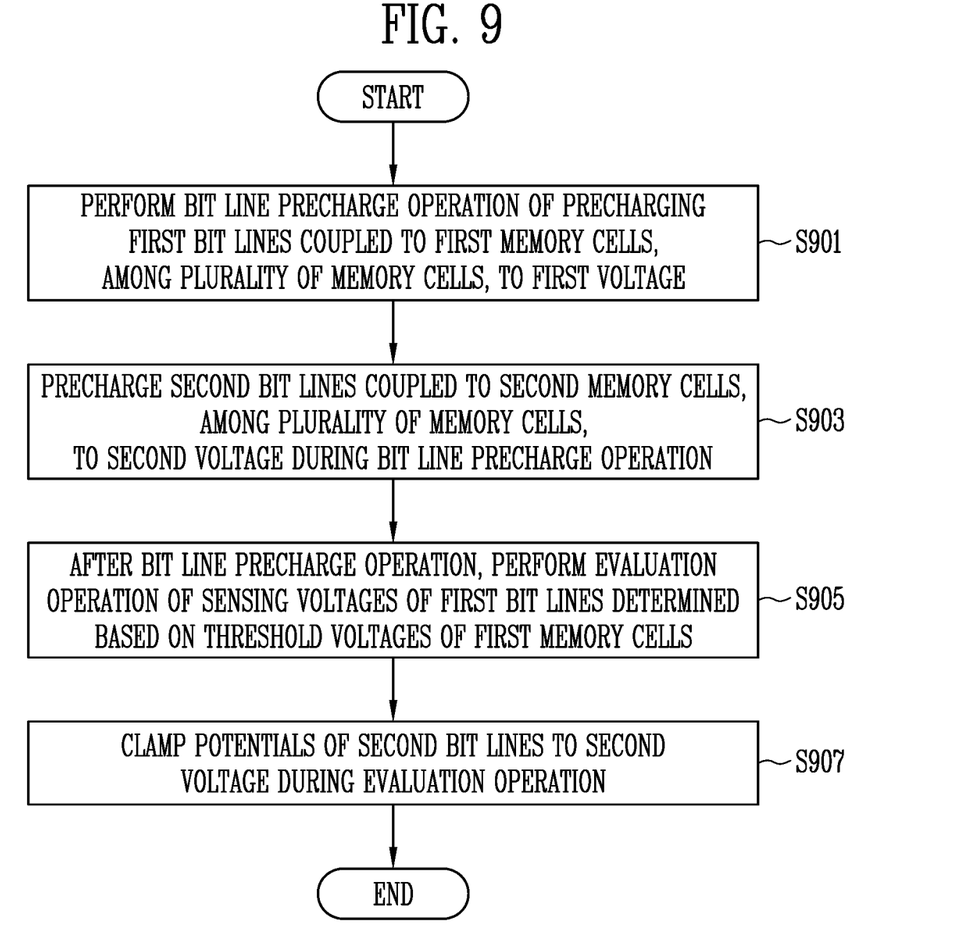
FIG. 9 is a flowchart illustrating an operation of a memory device according to an embodiment.

FIG. 9 is a flowchart illustrating the operation of a memory device according to an embodiment.

Referring to FIG. 9, at operation S901, the memory device may perform a bit line precharge operation of precharging first bit lines coupled to first memory cells, among a plurality of memory cells, to a first voltage.

At operation S903, the memory device may precharge second bit lines coupled to second memory cells, among the plurality of memory cells, to a second voltage during the bit line precharge operation.

At operation S905, the memory device may perform an evaluation operation of sensing the voltages of the first bit lines determined based on the threshold voltages of the first memory cells after the bit line precharge operation.

At operation S907, the memory device may clamp the potentials of the second bit lines to the second voltage during the evaluation operation.

In an embodiment, the first bit lines may be even bit lines, and the second bit lines may be odd bit lines. In an embodiment, the first bit lines may be odd bit lines, and the second bit lines may be even bit lines.

In accordance with the present disclosure, a memory device in which bit line coupling is improved and a method of operating the memory device are provided.

While the present invention has been illustrated and described in connection with various embodiments, those skilled in the art will understand in view of the present disclosure that various modifications may be made to any of the disclosed embodiments consistent with the teachings herein. Thus, the present invention encompasses all modifications that fall within the scope of the claims.

What is claimed is:

1. A memory device, comprising:
a plurality of memory cells; and
a plurality page buffers coupled to the plurality of memory cells through a plurality of bit lines, wherein the plurality of page buffers are configured to:
perform a bit line precharge operation of precharging first bit lines coupled to first memory cells, among the plurality of memory cells, to a first voltage, the bit line precharge operation being included in a memory operation of detecting threshold voltages of the first memory cells, and
clamp potentials of second bit lines coupled to second memory cells, among the plurality of memory cells, to a second voltage during the memory operation.

2. The memory device according to claim 1, wherein each of the page buffers comprises:
a first precharge circuit configured to precharge a node coupled to a corresponding bit line through a switch in response to a first precharge signal to precharge the corresponding bit line to the first voltage; and
a second precharge circuit configured to precharge the node in response to a second precharge signal to clamp the potential of the corresponding bit line to the second voltage.

3. The memory device according to claim 2, wherein the page buffers comprise:
first page buffers coupled to the first bit lines; and
second page buffers coupled to the second bit lines.

4. The memory device according to claim 3, wherein:
each of the first page buffers is configured to precharge a corresponding one of the first bit lines to the first voltage through a first precharge path, and
each of the second page buffers is configured to clamp the potential of a corresponding one of the second bit lines to the second voltage through a second precharge path different from the first precharge path.

5. The memory device according to claim 4, wherein:
the first precharge signal provided to the first page buffers is enabled and the second precharge signal provided to the first page buffers is disabled, and
the second precharge signal provided to the second page buffers is enabled and the first precharge signal provided to the second page buffers is disabled.

6. The memory device according to claim 3, wherein the memory operation includes the bit line precharge operation and an evaluation operation of sensing potentials of the first bit lines determined depending on the threshold voltages of the first memory cells.

7. The memory device according to claim 6, wherein the second precharge circuit in each of the second page buffers is configured to:
precharge the node of the corresponding second page buffer to a third voltage during the bit line precharge operation, and
clamp the potential of the node of the corresponding second page buffer to the third voltage during the evaluation operation.

8. The memory device according to claim 7, wherein the first precharge circuit in each of the first page buffers is configured to precharge the node of the corresponding first page buffer to a fourth voltage during the bit line precharge operation.

9. The memory device according to claim 8, wherein the third voltage is lower than or equal to the fourth voltage.

10. The memory device according to claim 3, wherein, during the memory operation, the first precharge signal provided to the second page buffers is disabled and the second precharge signal provided to the second page buffers is enabled.

11. The memory device according to claim 1, wherein the first bit lines are disposed alternately with respect to the second bit lines.

12. The memory device according to claim 1, wherein the memory operation is a read operation or a program verify operation performed on the first memory cells.

13. A page buffer, comprising:
a switch coupled between a bit line and a node;
a first precharge circuit coupled between the node and a supply voltage node, and configured to precharge the node to a first voltage based on whether a memory cell coupled to the bit line is a selected memory cell on which a memory operation is performed; and
a second precharge circuit coupled between the node and the supply voltage node, and configured to clamp a potential of the node to a second voltage based on whether the memory cell is the selected memory cell.

14. The page buffer according to claim 13, wherein the second precharge circuit clamps the potential of the node to the second voltage when the memory cell is an unselected memory cell on which the memory operation is not performed.

15. The page buffer according to claim 14, wherein the memory operation includes a bit line precharge operation of precharging the node to the first voltage and an evaluation operation of sensing a potential of the bit line determined depending on a threshold voltage of the memory cell, when the memory cell is the selected memory cell.

16. The page buffer according to claim 15, wherein the second precharge circuit precharges the node to the second voltage during the bit line precharge operation, and clamps the potential of the node to the second voltage during the evaluation operation, when the memory cell is the unselected memory cell.

17. The page buffer according to claim 13, wherein the second voltage is lower than or equal to the first voltage.

18. The page buffer according to claim 13, wherein the memory operation is a read operation or a program verify operation performed on the memory cell.

19. A method of operating a memory device including a plurality of memory cells, the method comprising:
  performing a bit line precharge operation of precharging first bit lines coupled to first memory cells, among the plurality of memory cells, to a first voltage;
  precharging second bit lines coupled to second memory cells, among the plurality of memory cells, to a second voltage during the bit line precharge operation;
  performing an evaluation operation of sensing voltages of the first bit lines determined based on threshold voltages of the first memory cells after the bit line precharge operation; and
  clamping potentials of the second bit lines to the second voltage during the evaluation operation.

20. The method according to claim 19, wherein the first bit lines are disposed alternately with respect to the second bit lines.

* * * * *